United States Patent
Kobayashi et al.

(10) Patent No.: US 8,150,457 B2
(45) Date of Patent: Apr. 3, 2012

(54) MOBILE RADIO APPARATUS

(75) Inventors: Hiroaki Kobayashi, Ishikawa (JP);
Haruhiko Kakitsu, Shizuoka (JP);
Kouta Aoki, Kanagawa (JP); Shigeaki Sakurazawa, Kanagawa (JP); Takahiro Ochi, Shizuoka (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 12/741,000

(22) PCT Filed: Sep. 30, 2008

(86) PCT No.: PCT/JP2008/002735
§ 371 (c)(1),
(2), (4) Date: Apr. 30, 2010

(87) PCT Pub. No.: WO2009/057244
PCT Pub. Date: May 7, 2009

(65) Prior Publication Data
US 2010/0234066 A1 Sep. 16, 2010

(30) Foreign Application Priority Data
Oct. 31, 2007 (JP) .................................. 2007-284327

(51) Int. Cl.
*H04M 1/00* (2006.01)

(52) U.S. Cl. ..................................... 455/556.1; 455/570
(58) Field of Classification Search ............... 455/556.1, 455/550.1, 556.2
See application file for complete search history.

(56) References Cited

U.S. PATENT DOCUMENTS
6,904,298 B2 * 6/2005 Arai et al. .................. 455/556.1

FOREIGN PATENT DOCUMENTS
JP 09-167214 A 6/1997
JP 2002-325127 A 11/2002
(Continued)

OTHER PUBLICATIONS

International Search Report, mailed Nov. 4, 2008, issued in corresponding International Application No. PCT/JP2008/002735, filed Sep. 30, 2008.

*Primary Examiner* — Tu X Nguyen
(74) *Attorney, Agent, or Firm* — Seed IP Law Group PLLC

(57) ABSTRACT

A mobile radio apparatus wherein the degradation of communication performance caused by electromagnetic noise can be precluded with enhanced reliability. This mobile telephone unit (100) comprises a camera body (107); a circuit board (106) that includes partial board parts (104, 105) located on the two respective sides of the camera body (107); a camera shield (108) that is located close to and opposed to the back surface of the camera body (107) (which is opposite to the image pickup plane); a camera connection connector (110) that is connected to the camera body (107) and grounded in the partial board part (104); a frequency limiting part (111) that is connected to the camera shield (108) and grounded in the partial board part (105); a feeding part (117) that is located in the partial board part (105); and a matching circuit part (113) that is located and grounded in the partial board part (105). This can limit those ones of the frequencies of interference components dissipated from the camera body (107) to the circuit board (106) which adversely affect the communication, so that the degradation of communication performance caused by electromagnetic noise can be precluded with enhanced reliability.

6 Claims, 13 Drawing Sheets

FOREIGN PATENT DOCUMENTS

| | | | | | | |
|---|---|---|---|---|---|---|
| JP | 2003-273767 | A | 9/2003 | JP | 2006-506928 A | 2/2006 |
| JP | 2004-172790 | A | 6/2004 | JP | 2007-180218 A | 7/2007 |
| JP | 2006-005567 | A | 1/2006 | WO | 2004/038940 A1 | 5/2004 |
| JP | 2006-005706 | A | 1/2006 | WO | 2005/057723 A1 | 6/2005 |

* cited by examiner

MOBILE RADIO APPARATUS

TECHNICAL FIELD

The present invention relates to a mobile radio apparatus having an imaging section.

BACKGROUND ART

Most mobile phones in widespread use currently are provided with a camera. In the case of a camera-equipped mobile phone, the camera itself is a source to generate electromagnetic noise when the camera operates. This electromagnetic noise may cause a decrease in antenna receiving sensitivity. In addition, when an antenna current flows in an antenna, depending on the frequency band, a high-frequency current excited by the antenna current flows in an electronic component provided in the vicinity of the antenna, which causes the electronic component to resonate. This may also cause the antenna performance to deteriorate.

A camera module that can prevent the above-described deterioration of antenna receiving sensitivity caused by electromagnetic noise generated by the camera has been disclosed in, for example, Patent Document 1. The camera module disclosed in Patent Document 1 has a camera body and a camera shield structure that holds this camera body and covers the circumference of the camera body, and the camera shield structure is provided to directly contact the casing of the mobile phone. The casing of the mobile phone is made of conductive metal and is electrically connected with an earth terminal of the circuit board. That is, the electric potential of the casing is the ground potential of the mobile phone.

Moreover, the camera shield structure is made of a material having electrical conductivity. Accordingly, the camera shield structure is provided to directly contact the casing, so that the camera shield structure is maintained at the ground potential of the mobile phone. Thus, the camera shield structure covering the camera body is maintained at the ground potential of the mobile phone, and therefore the electrical noise emitted from the camera body, which is the source to generate the electrical noise, can be prevented. That is, the camera shield structure can exert an electromagnetic shield function.

In addition, with a mobile phone having the configuration disclosed in Patent Document 1, the antenna current flowing in the camera module is spread over the circuit board, and therefore the above-described deterioration of antenna performance can be resolved.

Patent Document 1: Japanese Patent Application Laid-Open No. 2007-180218

DISCLOSURE OF INVENTION

Problems to be Solved by the Invention

Here, communication frequency bands have increased recently, and there are mobile phones that communicate in various frequency bands.

These mobile phones being capable of communicating in a wide band have a problem that, depending on the frequency used, deterioration of communication performance cannot be prevented only by adopting the above-described configuration (that is, a configuration in which the camera module and the circuit board are directly connected).

It is therefore an object of the present invention to provide a mobile radio apparatus that can more reliably prevent deterioration of communication performance caused by electromagnetic noise from the camera body and deterioration of antenna performance caused by the camera body.

Means for Solving the Problem

The mobile radio apparatus according to the present invention has a configuration including: an imaging section; a circuit board that has a cutout in one end and includes a first partial substrate section and a second partial substrate section located in both sides of the imaging section provided in the cutout; a conductive member that is arranged in a vicinity of the imaging section; and a reactance element that connects between a ground of the circuit board and the conductive member.

Advantageous Effects of Invention

According to the present invention, interference components of frequencies exerting a negative influence on communication can be blocked by providing reactance elements that connect between the ground of the circuit board and conductive members provided in the vicinity of the imaging section, so that a mobile radio apparatus can be provided that can reliably prevent deterioration of communication performance caused by electromagnetic noise from the camera body and deterioration of antenna performance caused by the camera body.

BEST MODE FOR CARRYING OUT THE INVENTION

Figure 1:
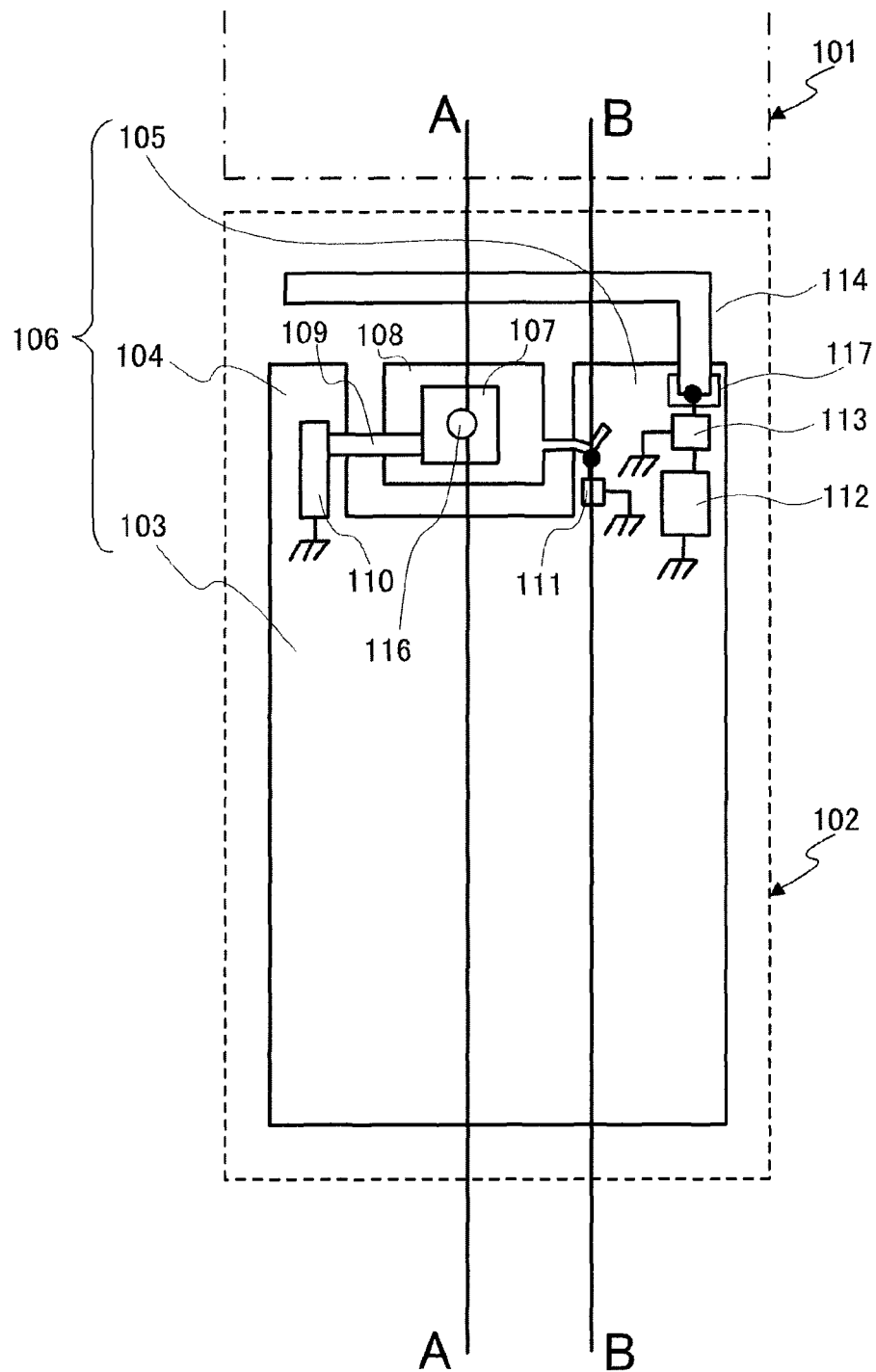
FIG. 1 shows a configuration of a camera-equipped mobile phone according to embodiment 1 of the present invention.

Now, embodiments of the present invention will be described in detail with reference to the accompanying drawings. Here, the same components in embodiments will be assigned the same reference numerals and overlapping descriptions will be omitted.

Embodiment 1

Figure 2:
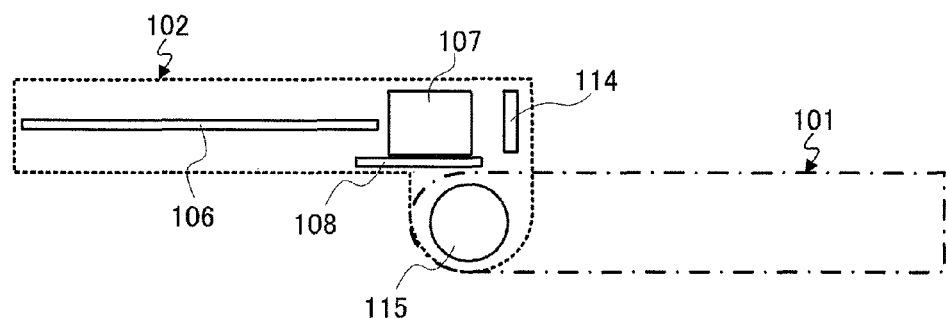
FIG. 2 shows a cross sectional view of FIG. 1 along line A-A.

FIG. 1 is a configuration diagram of a camera-equipped mobile phone according to the present embodiment. FIG. 2 is a cross sectional view of FIG. 1 along line A-A, and FIG. 3 is a cross sectional view of FIG. 1 along line B-B.

Figure 3:
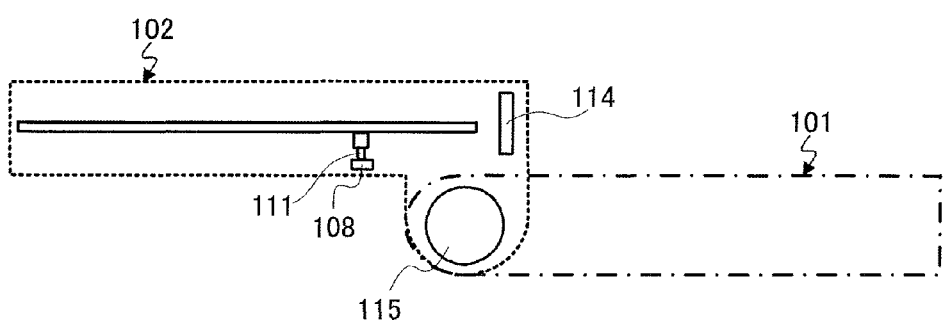
FIG. 3 shows a cross sectional view of FIG. 1 along line B-B.

As shown in FIG. 1 to FIG. 3, camera-equipped mobile phone 100 has upper housing 101 including a display section such as a LCD and lower housing 102 including various keys and so forth. Upper housing 101 and lower housing 102 are coupled to freely open and close, through coupling section 115 such as a hinge (see FIG. 2 and FIG. 3). In addition, camera-equipped mobile phone 100 is configured to allow communication in one or more frequency bands such as 800 M (mega) Hz band, 2 G (giga) Hz band and 1.7 GHz band.

As shown in FIG. 1, in lower housing 102 having a rectangular shape in a plan view, circuit board 106 having a cutout section and camera body 107 provided in this cutout section are arranged. Here, circuit board 106 has substrate body 103 and partial substrate sections 104 and 105 extending from one end of substrate body 103. Partial substrate sections 104 and 105 extend parallel to each other from positions apart from one another in one end side of substrate body 103. Then, a cutout section is formed by partial substrate sections 104 and 105 and substrate body 103. In other words, the cutout section is formed by cutting out one end side of the circuit board in the shape of the letter U. In addition, a ground pattern (not shown) is provided over circuit board 106.

Camera body 107 is provided in the cutout section of circuit board 106. Although camera body 107 is a thicker part among the parts of camera-equipped mobile phone 100, camera body 107 is arranged in the cutout section of circuit board 106, so that camera body 107 is arranged without overlapping circuit board 106. Thus, the thickness of the housing of camera-equipped mobile phone 100 can be reduced. Here, explanation will be made assuming that camera body 107 is provided in lower housing 102 such that the surface (imaging surface) of camera body 107, which is the side lens 116 is directed to, faces the back side of lower housing 102 (the surface side opposite the surface overlapping upper housing 101 in a state in which mobile phone 100 is closed).

Flexible cable 109 for securing electrical connection to the circuit board 106 side is connected to camera body 107. Camera connecting connector 110 provided in partial substrate section 104 is connected to one end of flexible cable 109 connecting with this camera body 107 in the other end. Camera connecting connector 110 is connected to the ground pattern provided on circuit board 106 in partial substrate section 104. Hereinafter, this ground point of camera connecting connector 110 to the ground pattern may be referred to as "first ground point."

A plate-like camera shield 108 is provided in the vicinity of camera body 107. Camera shield 108 is formed by a conductive element and is provided in the position in which camera shield 108 and camera body 107 are high-frequency coupled, or provided in a state in which camera shield 108 contacts camera body 107. Here, plate-like camera shield 108 is arranged to face the back surface (the surface opposite the above-described imaging surface), and its area is larger than that of the above-described back surface of camera body 107.

Camera shield 108 is connected to the ground pattern provided on circuit board 106 in partial substrate section 105. In addition, camera shield 108 is connected to the ground pattern via frequency blocking section 111. That is, camera shield 108, frequency blocking section 111 and the ground pattern are connected in series in the order described. Here, camera shield 108 is connected to the ground of circuit board 106 in partial substrate section 105 apart from partial substrate section 104 in which camera connecting connector 110 is provided.

Frequency blocking section 111 is configured by a reactance element such as a capacitor and a coil. Frequency blocking section 111 is connected to the ground pattern, and hereinafter, the ground point of frequency blocking section 111 to the ground pattern may be referred to as "second ground point."

Communication antenna 114 is provided in the end (upper end) of the coupling section 115 side of lower housing 102, which couples with upper housing 101, along the upper end. That is, antenna 114 is placed to face the surface of camera body 107 opposite substrate body 103. That is, camera body 107 is provided to be surrounded by the U-shaped part formed by partial substrate sections 104 and 105 and substrate body 103 and antenna 114. Here, although lower housing 102 is generally held by the user when the camera is used, it is unlikely that the upper end part of lower housing 102 is held, and therefore antenna 114 is provided there.

Antenna 114 is connected with power feeding section 117 and matching circuit section 113 provided in partial substrate section 105. Matching circuit section 113 is connected to the ground pattern provided on circuit board 106 in partial substrate section 105. Hereinafter this ground point of the matching circuit section 113 to the ground pattern may be referred to as "third ground point."

When the camera function operates in camera-equipped mobile phone 100 configured as described above, electromagnetic noise is emitted from camera body 107. This electromagnetic noise may be a cause of interference to communication of mobile phone 100. In particular, since camera body 107 is provided in the cutout part of circuit board 106 in order to reduce the thickness of mobile phone 100, the area to contact the ground pattern is reduced. Because this ground contact area is small, the structure of mobile phone 100 in which noise is easily emitted from camera body 107.

Then, to take measures for cancelling this interference factor, a conductive member (camera shield 108) is provided in the vicinity of camera body 107 as before, and furthermore, this conductive member is connected to the ground pattern on circuit board 106.

When the band for use in communication is blocked to one frequency band, it may be possible to cancel interference factors in communication by directly connecting camera shield 108 and the ground pattern of circuit board 106 to drain noise components to the substrate ground.

However, with mobile phone 100 using a plurality of frequency bands in communication, depending on the frequency band used in communication, direct and simple connection between camera shield 108 and the ground pattern on circuit board 106 is more likely to exert a negative influence on communication.

Therefore, in mobile phone 100 according to the present embodiment, camera shield 108 and the ground pattern on circuit board 106 are connected via frequency blocking section 111 having a frequency blocking function. That is, mobile phone 100 is provided with a reactance element (frequency blocking section 111) that connects between the ground of circuit board 106 and the conductive member (camera shield 108). Thus, by providing the reactance element having an appropriate frequency-blocking between the ground of circuit board 106 and the conductive member (camera shield 108), the frequency exerting a negative influence on communication, among the frequencies of interference components let out from camera body 107 to circuit board 106, can be blocked. As a result of this, deterioration of antenna receiving sensitivity caused by electromagnetic noise from camera body 107 can be prevented.

In addition, when a radio signal is transmitted and received in antenna 114, a high-frequency current excited by the antenna current flowing in antenna 114 flows in camera body 107, which is an electronic part provided in the vicinity of antenna 114. Depending on the frequency band used in communication, if this high-frequency current flowing in camera body 107 simply drains to the substrate ground, a negative influence is more likely to be exerted on communication.

As described above, since mobile phone 100 has a reactance element that connects between the ground of circuit board 106 and a conductive member (camera shield 108) and that has a frequency blocking function, it is possible to prevent deterioration of antenna performance caused by unnecessary resonance resulting from a high-frequency current flowing in camera body 107.

As described above, according to the present embodiment, mobile phone 100 has camera body 107; circuit board 106 including partial substrate sections 104 and 105 provided in both sides of camera body 107; camera shield 108 placed in the vicinity of the back surface (the opposite surface of the imaging surface) of camera body 107 to face the back surface of camera body 107; camera connecting connector 110 that is connected to camera body 107 and is connected to the ground in partial substrate section 104; frequency blocking section 111 that is connected to camera shield 108 and is connected to the ground in partial substrate section 105; and matching circuit section 113 that is provided in partial substrate section 105 and is connected to the ground.

Here, "placed in the vicinity" means that camera 107 and camera shield 108 are placed in the position where camera body 107 and camera shield 108 are high-frequency coupled, or that camera body 107 and camera shield 108 are provided in contact with each other.

By this means, a mobile radio apparatus can be realized that can reliably prevent deterioration of communication performance caused by electromagnetic noise and deterioration of antenna performance caused by the camera body.

Here, when the interval between camera body 107 and power feeding section 117 is greater than ¼ of wavelength $\lambda$ corresponding to the frequency used in communication, the deterioration of antenna receiving sensitivity caused by electromagnetic noise from camera body 107 and deterioration of antenna performance caused by unnecessary resonance of camera body 107 described above, are low. Therefore, when the interval between camera body 107 and power feeding section 117 is equal to or smaller than $\lambda/4$, if camera shield 108 and the ground pattern on circuit board 106 are connected via frequency blocking section 111, a greater effect can be provided.

In addition, in order to maximize the above-described effect of preventing deterioration, the interval between "first ground point" and "second ground point" is preferably equal to or greater than $\lambda$ (wavelength corresponding to the frequency used in communication)/8. Further, more preferably, "second ground point" is placed in the vicinity of "third ground point." Here, the interval between "first ground point" and "second ground point" is equivalent to the minimum distance across circuit board 106.

Here, mobile phone 100 in which camera shield 108, frequency blocking section 111 and the ground pattern are connected has been described. However, when a conductive member is included in camera body 107, a configuration in which the conductive member, frequency blocking section 111 and ground pattern are connected in series, may be applicable. This configuration allows the same effect as the above-described effect. Here, in this case, it is not necessary to provide camera shield 108 in mobile phone 100 in particular. The important idea is that frequency blocking section 111 can connect between the ground of circuit substrate 106 and the conductive member provided in the vicinity of the imaging section in series.

Embodiment 2

The present embodiment relates to layout variations of the camera connecting connector and the frequency blocking section.

Following embodiments correspond to layout variations, respectively.

Example 1

Figure 4:
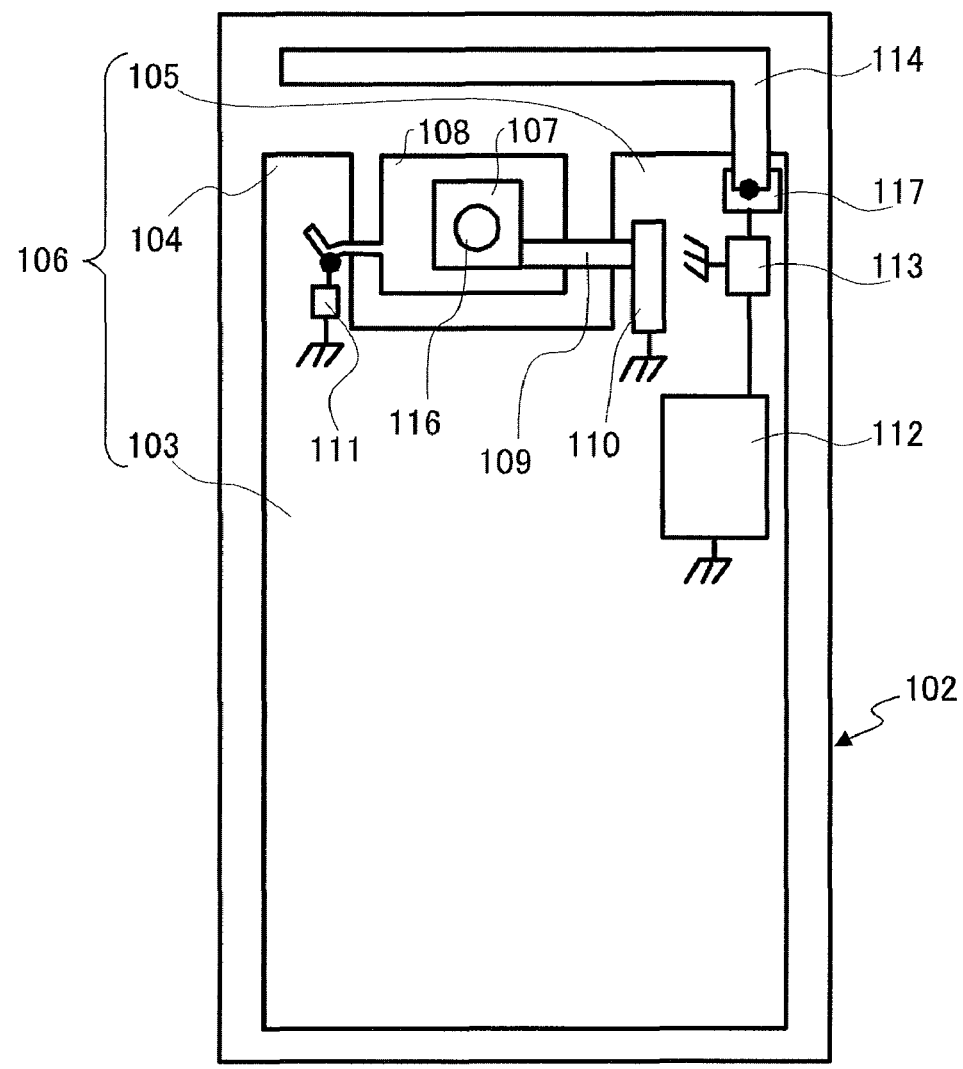
FIG. 4 shows a drawing of a configuration (layout variations of the camera connecting connector and the frequency blocking section in FIG. 1) of a camera-equipped mobile phone according to embodiment 2.

In mobile phone 100A shown in FIG. 4, partial substrate sections in which camera connecting connector 110 and frequency blocking section 111 are connected to the ground are reversed as compared to the case of mobile phone 100. That is, camera connecting connector 110 is connected to the ground pattern provided on circuit board 106 in partial substrate section 105 in which power feeding section 117 is provided, while frequency blocking section 111 is connected to the ground pattern provided on circuit board 106 in partial substrate section 104, which is opposite to partial substrate section 105 across camera body 107.

By providing this layout, it is also possible to prevent deterioration of antenna receiving sensitivity and deterioration of antenna performance caused by unnecessary resonance of camera body 107.

Example 2

Figure 5:
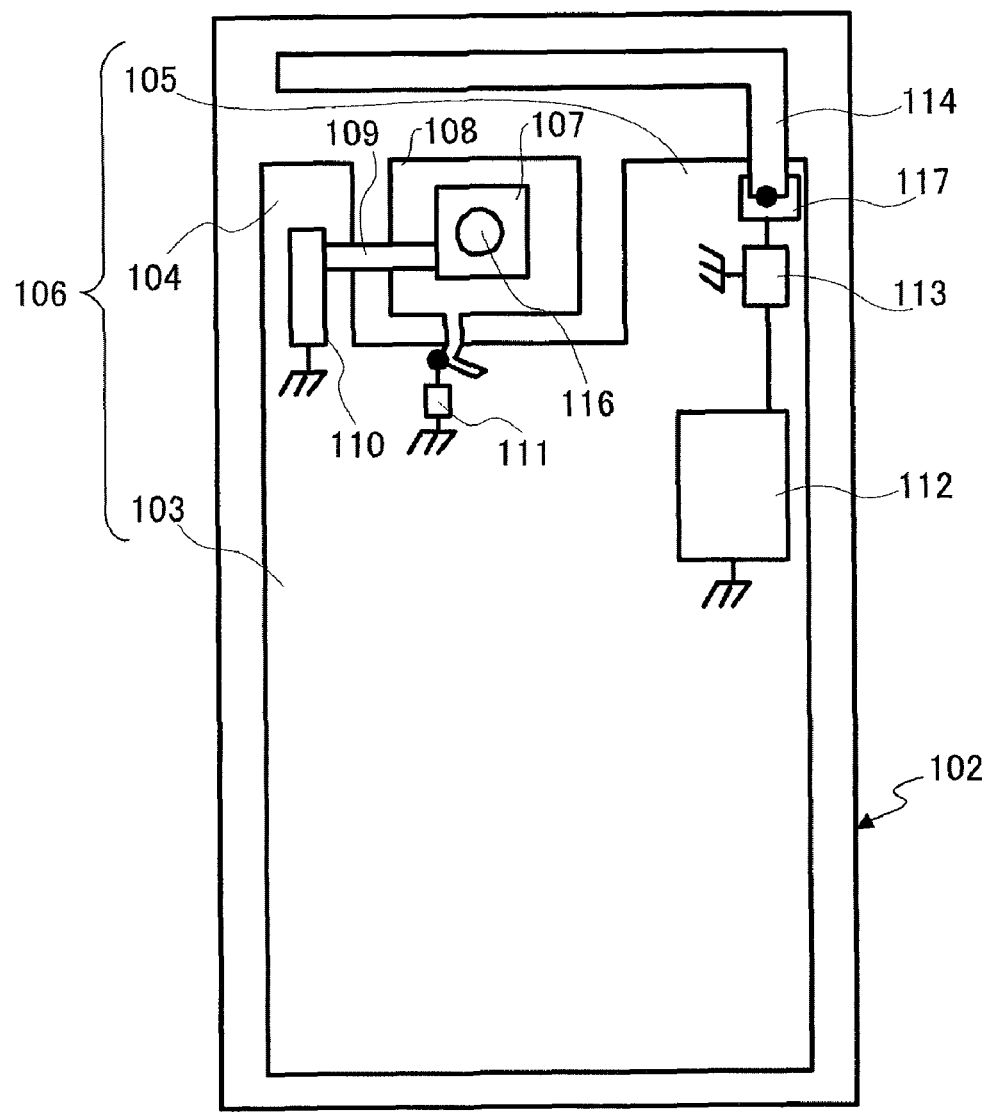
FIG. 5 shows a drawing of a configuration (layout variations of the camera connecting connector and the frequency control section in FIG. 1) of the camera-equipped mobile phone according to embodiment 2.

With mobile phone 100B shown in FIG. 5, unlike the case of mobile phone 100, frequency blocking section 111 is not connected to the ground in the partial substrate section but is connected to the ground in substrate body 103. That is, in mobile phone 100B, frequency blocking section 111 is connected to the ground in substrate body 103 while camera connecting connector 110 is connected to the ground pattern in partial substrate section 104 opposite partial substrate section 105 in which power feeding section 117 is provided, across camera body 107. That is, frequency blocking section 111, power feeding section 117 and camera connecting connector 110 are connected to the ground in substrate body 103, partial substrate section 105 and partial substrate section 104 forming the U-shaped part, respectively. By providing this layout, it is also possible to prevent deterioration of antenna receiving sensitivity and deterioration of antenna performance caused by unnecessary resonance of camera body 107. Here, in order to maximize the effect of preventing deterioration, preferably, the interval between "first ground point" at which camera connecting connector 110 is connected to the ground pattern on partial substrate section 104 and "second ground point" at which frequency blocking section 111 is connected to the ground pattern on substrate body 103, is equal to or greater than λ (wavelength corresponding to the frequency used in communication)/8.

Example 3

Figure 6:
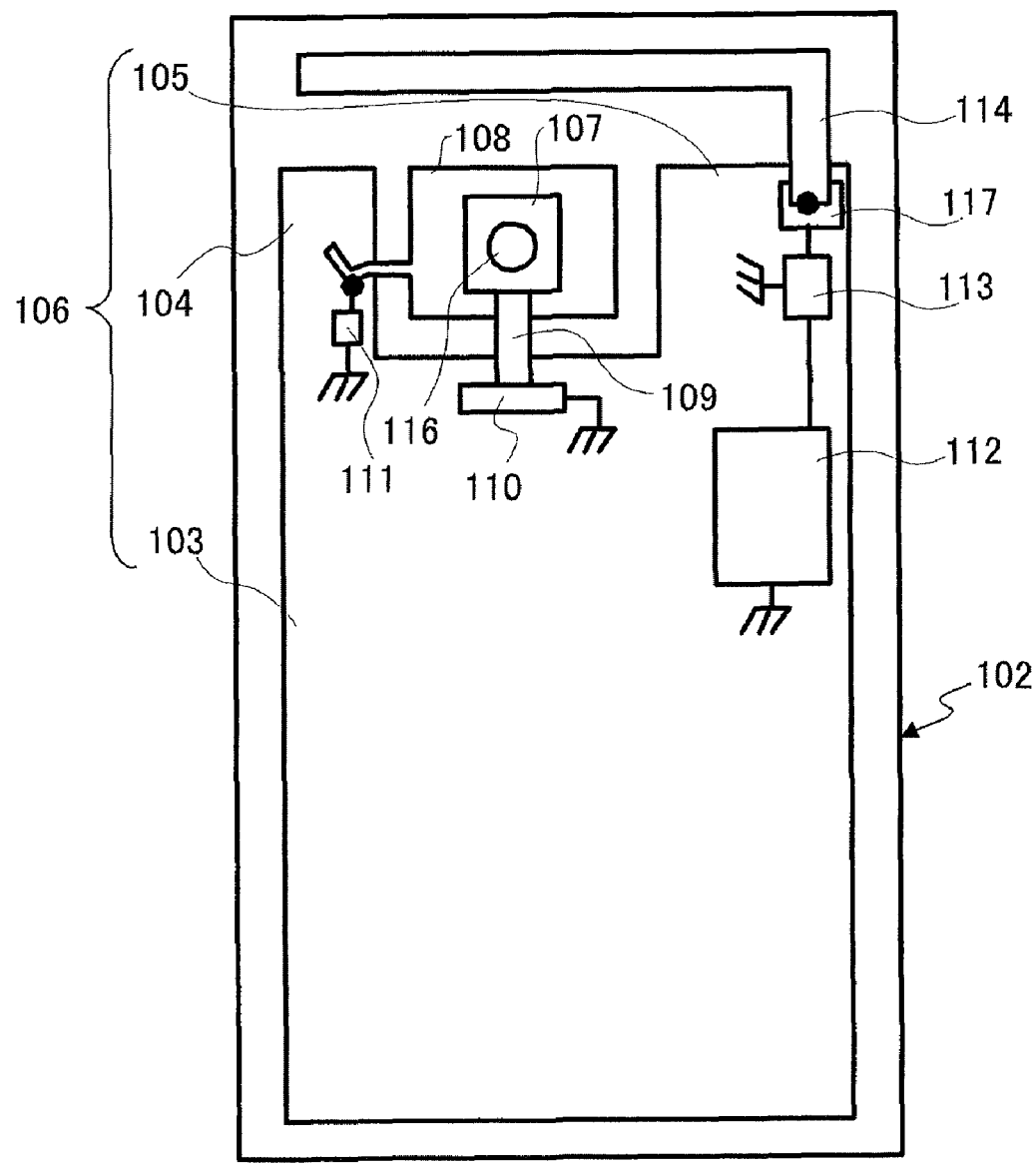
FIG. 6 shows a drawing of a configuration (layout variations of the camera connecting connector and the frequency control section in FIG. 1) of the camera-equipped mobile phone according to embodiment 2.

With mobile phone 100c shown in FIG. 6, unlike the case of mobile phone 100, frequency blocking section 111 is provided in partial substrate section 104 differing from the partial substrate section in which power feeding section 117 is provided, while camera connecting connector 110 is provided in substrate body 103. By providing this layout, it is also possible to prevent deterioration of antenna receiving sensitivity and deterioration of antenna performance caused by unnecessary resonance of camera body 107.

Figure 7:
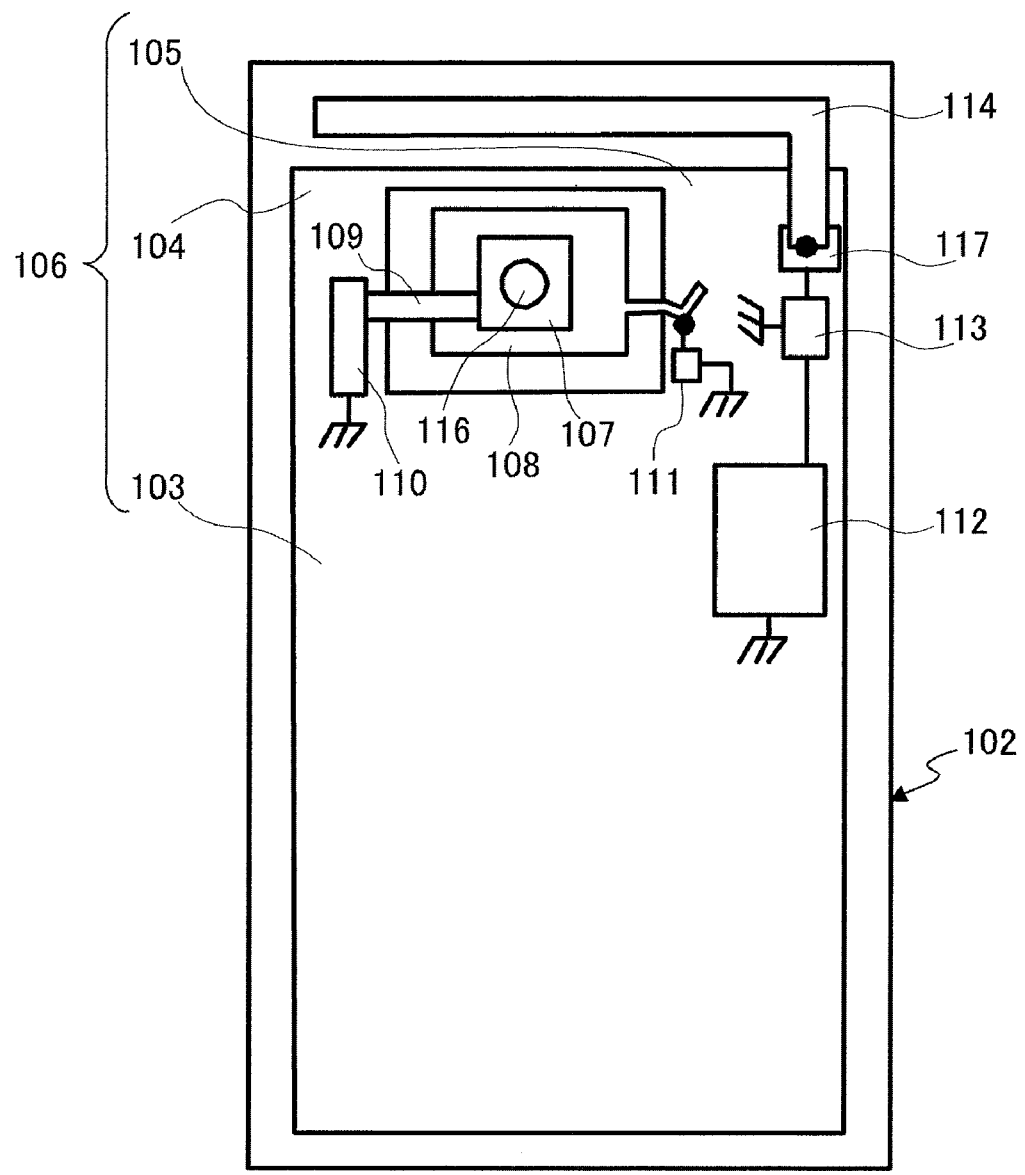
FIG. 7 shows a drawing explaining shape variations of the circuit board.

Here, examples 1 to 3 of the present embodiment and embodiment 1 have been described that partial substrate section 104 and partial substrate section 105 are not coupled in the end opposite the substrate body 103 side. However, partial substrate section 104 and partial substrate section 105 may be coupled in the end opposite the substrate body 103 side. In FIG. 7, a configuration is shown in which partial substrate section 104 and partial substrate section 105 are coupled in the end opposite the substrate body 103 side in mobile phone 100 according to embodiment 1.

Embodiment 3

The present embodiment relates to configuration variations of the frequency blocking section.

Figure 8A:
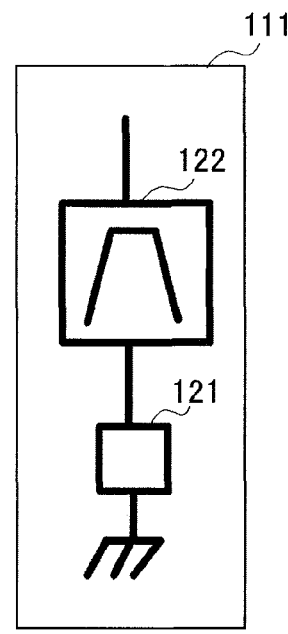
FIG. 8A shows a drawing explaining a configuration of a frequency blocking section according to embodiment 3.

In the mobile phone shown in embodiment 1 and embodiment 2, frequency blocking section 111 is configured by only a reactance element. On the other hand, in the present embodiment as shown in FIG. 8A, frequency blocking section 111 has a filter 122 connected to reactance element 121 in series, in addition to reactance element 121. In frequency blocking section 111, filter 122 and reactance element 121 are arranged, in the order described, from the camera shield 108 side.

Figure 8B:
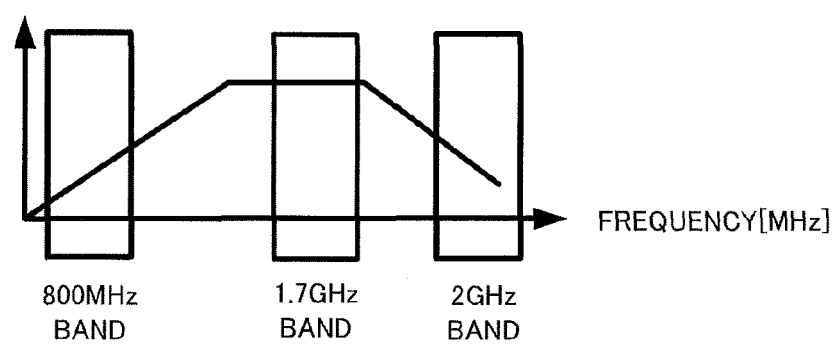
FIG. 8B shows a drawing explaining a filter characteristic according to embodiment 3.

The frequency characteristic of a bandpass filter used as filter 122 is shown in FIG. 8B. With the characteristic shown in the drawing, the bandpass characteristic in the 800 MHz band and the 2 GHz band is low. That is, as for the waves having frequencies in the 800 MHz band and the 2 GHz band, an electrically open state (that is, a state in which there is no electrical connection) is provided between camera shield 108 and reactance element 121. Meanwhile, the bandpass characteristic in the 1.7 GHz band is high. That is, as for the wave having the frequency in the 1.7 GHz band, a short-circuit state (that is, a state in which there is electrical connection) is made between camera shield 108 and reactance element 121.

In this case, if reactance element 121 has a characteristic to block the frequency in the 1.7 GHz band, interference components from this frequency band can be cancelled.

That is, it is possible to cancel interference components from a wide band by providing in series reactance element 121 and filter 122 each being capable of blocking a different frequency band (each having different frequency blocking characteristic) between camera shield 108 and the ground pattern.

This combination of the blocked frequency bands by reactance element 121 and filter 122 may be made as shown in FIG. 9A to FIG. 11B.

Figure 9A:
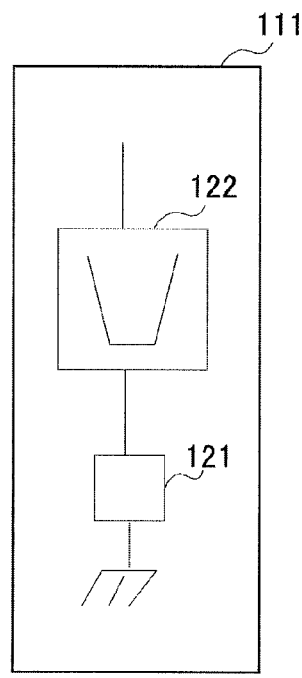
FIG. 9A shows a drawing explaining a configuration of the frequency blocking section according to embodiment 3.
Figure 9B:
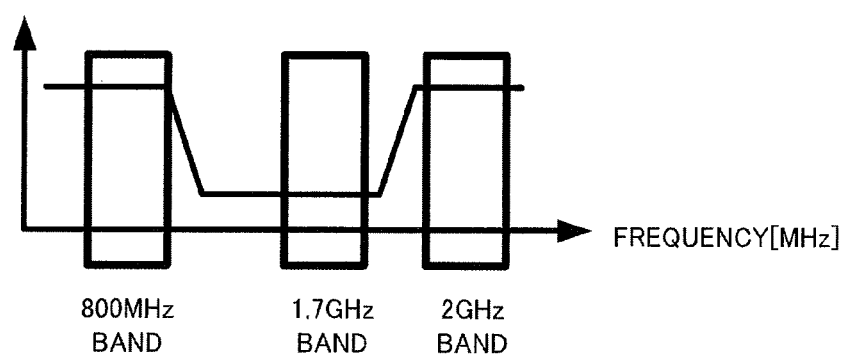
FIG. 9B shows a drawing explaining the filter characteristic according to embodiment 3.

In the example shown in FIG. 9A, reactance element 121 and filter 122, which is a band elimination filter, are arranged in series in frequency blocking section 111. With the filter characteristic shown in FIG. 9B, the bandpass characteristic in the 1.7 GHz band is low. That is, as for the wave having the frequency in the 1.7 GHz band, an electrically open state (that is, a state in which there is no electrical connection) is provided between camera shield 108 and reactance element 121. On the other hand, the bandpass characteristic in the 800 MHz band and the 2 GHz band is high. That is, as for the waves having frequencies in the 800 MHz band and the 2 GHz band, a short-circuit state (that is, a state in which there is electrical connection) is provided between camera shield 108 and reactance element 121.

In this case, by providing reactance element 121 with a characteristic to block the frequencies in the 800 MHz band and the 2 GHz band, interference components from those frequency bands can be canceled.

Therefore, it is also possible to cancel interference components from a wide band by this configuration.

Figure 10A:
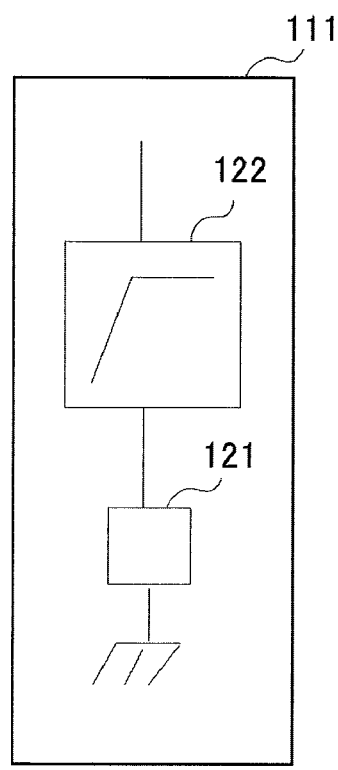
FIG. 10A shows a drawing explaining a configuration of the frequency blocking section according to embodiment 3.
Figure 10B:
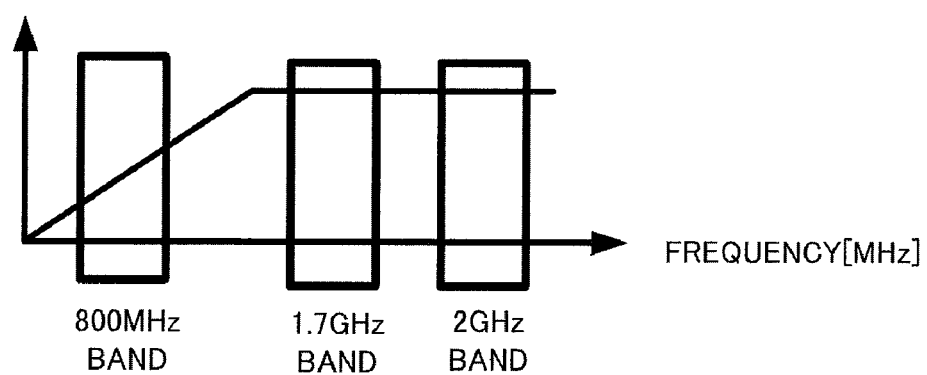
FIG. 10B shows a drawing explaining the filter characteristic according to embodiment 3.

In an example shown in FIG. 10A, filter 122 is a highpass filter. With the filter characteristic shown in FIG. 10B, the bandpass characteristic in the 800 MHz band is low and the bandpass characteristic in the 1.7 GHz band and the 2 GHz band is high. Therefore, by providing reactance element 121 with the frequency characteristic to cancel the interference components from the 1.7 GHz band and the 2 GHz band to provide frequency blocking section 111 with this configuration, it is also possible to cancel interference components from a wide band.

Figure 11A:
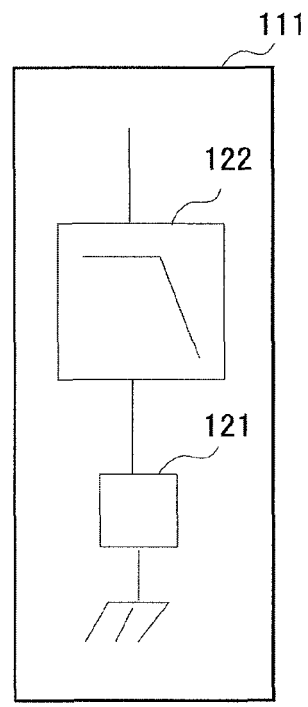
FIG. 11A shows a drawing explaining a configuration of the frequency blocking section according to embodiment 3.
Figure 11B:
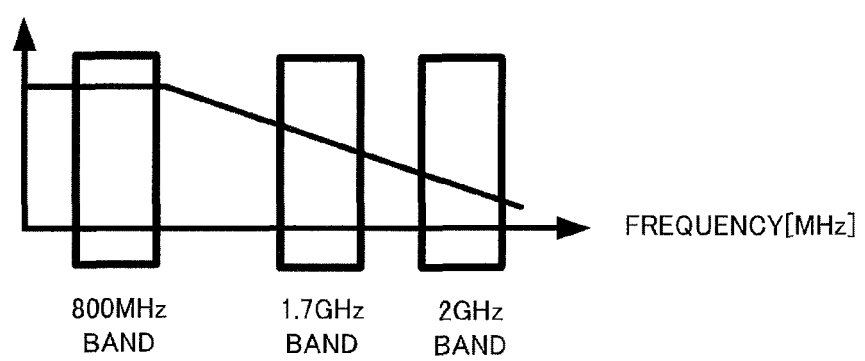
FIG. 11B shows a drawing explaining the filter characteristic according to embodiment 3.

In an example shown in FIG. 11A, filter 122 is a lowpass filter. With the filter characteristic shown in FIG. 11B, the bandpass characteristic in the 800 MHz band is high and the bandpass characteristic in the 2 GHz band is low. Therefore, by providing reactance element 121 with the frequency characteristic to cancel the interference components from the 800 MHz band to provide frequency blocking section 111 with this configuration, it is also possible to cancel interference components from a wide band.

Figure 12:
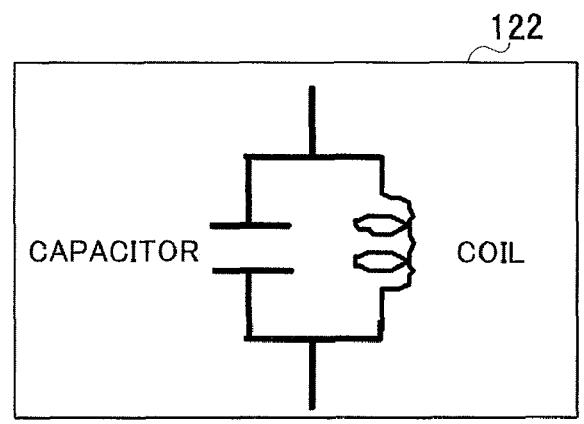
FIG. 12 shows a configuration of the filter in FIG. 9.

Incidentally, for example, the band elimination filter is configured by connecting a capacitor and a coil in parallel as shown in FIG. 12. Therefore, with frequency blocking section 111 shown in the present embodiment, it is possible to consider a plurality of reactance elements to be connected in series.

Embodiment 4

The present embodiment relates to configuration variations of the frequency blocking section. Here, in the present embodiment, a plurality of reactance elements having different frequency characteristics are provided, and those reactance elements connected between the camera shield and the ground pattern are switched in accordance with the frequency band used in communication.

Figure 13:
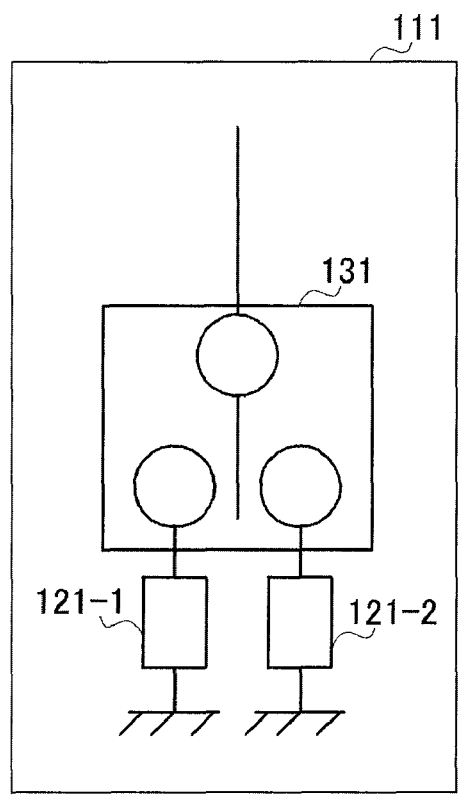
FIG. 13 shows a drawing showing a configuration of a frequency blocking section according to embodiment 4.

As shown in FIG. 13, frequency blocking section 111 according to the present embodiment has a plurality of reactance elements (reactance elements 121-1 and 2) that can control different frequency bands one another and that are connected parallel to one another, and switch 131 that switches the reactance element to be connected to camera shield 108 between reactance 121-1 and reactance element 121-2.

By providing this configuration, it is possible to cancel interference components from different frequency bands by switching switch 131.

Here, the frequency bands that can be cancelled at a time by frequency blocking section 111 according to the present embodiment are narrower than in embodiment 3. However, the frequency band of interference components particularly exerting a negative influence on communication differs in each frequency band used in communication. Therefore, it is possible to prevent deterioration of communication quality of the mobile phone by switching to reactance element 121 having an appropriate frequency blocking characteristic for each frequency used in communication.

Figure 14:
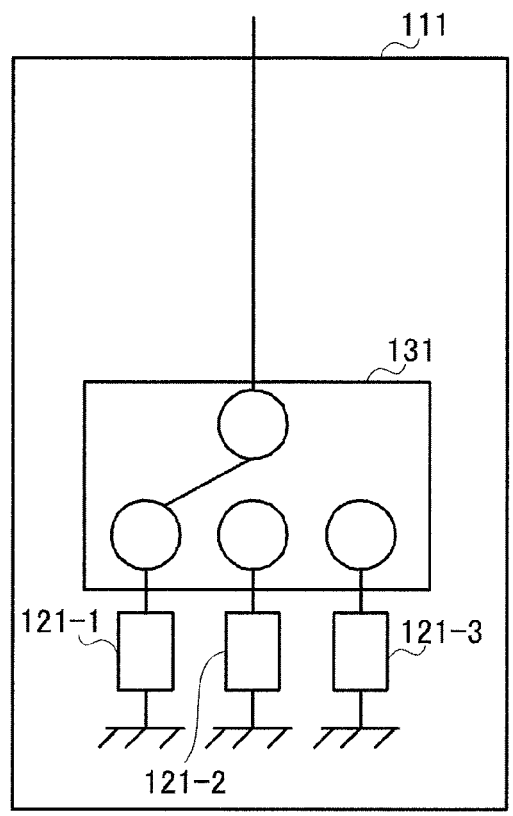
FIG. 14 shows a drawing showing a configuration of a frequency blocking section according to embodiment 4.

In addition, here, the number of reactance elements connected in parallel is not particularly blocked and may be three as shown in FIG. 14 or more.

Embodiment 5

The present embodiment relates to the structure of the part connecting the camera shield, the frequency blocking section and the ground pattern. Here, the structure of the connecting part in a case where mobile phone 100 according to embodiment 1 is a base configuration will be described with reference to FIG. 15 and FIG. 16. Here, the configuration of the connecting part described below is naturally applicable to the configuration variations of the camera-equipped mobile phone described in embodiment 2.

Figure 15:
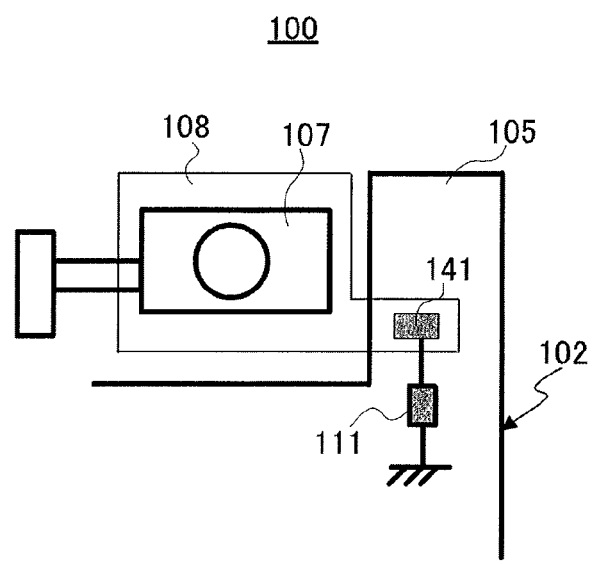
FIG. 15 shows a drawing explaining a structure of a connecting part of a camera shield, a frequency blocking section and a ground pattern according to embodiment 5.

As a first example of the structure, mobile phone 100 has connecting part 141 configured by an elastic body such as a spring as shown in FIG. 15. As shown in FIG. 2 and FIG. 3, in mobile phone 100, camera shield 108 and partial substrate section 105 partially overlap, and in this first example, connecting part 141 and frequency blocking section 111 are provided in the surfaces facing the overlapping parts, respectively. That is, in mobile phone 100 in FIG. 15, connecting part 141 is provided on the surface of camera shield 108 in the camera body 107 side. Meanwhile, frequency blocking section 111 is provided on the surface of partial substrate section 105 of circuit board 106.

Camera shield 108 and partial substrate section 105 are arranged to keep the interval between them shorter than the natural length of connecting part 141, and therefore connecting part 141 is connected with frequency blocking section 111 provided on the surface of partial substrate section 105 in a state of being biased. Thus, camera shield 108, frequency blocking section 111 and the ground pattern can be connected reliably.

Figure 16:
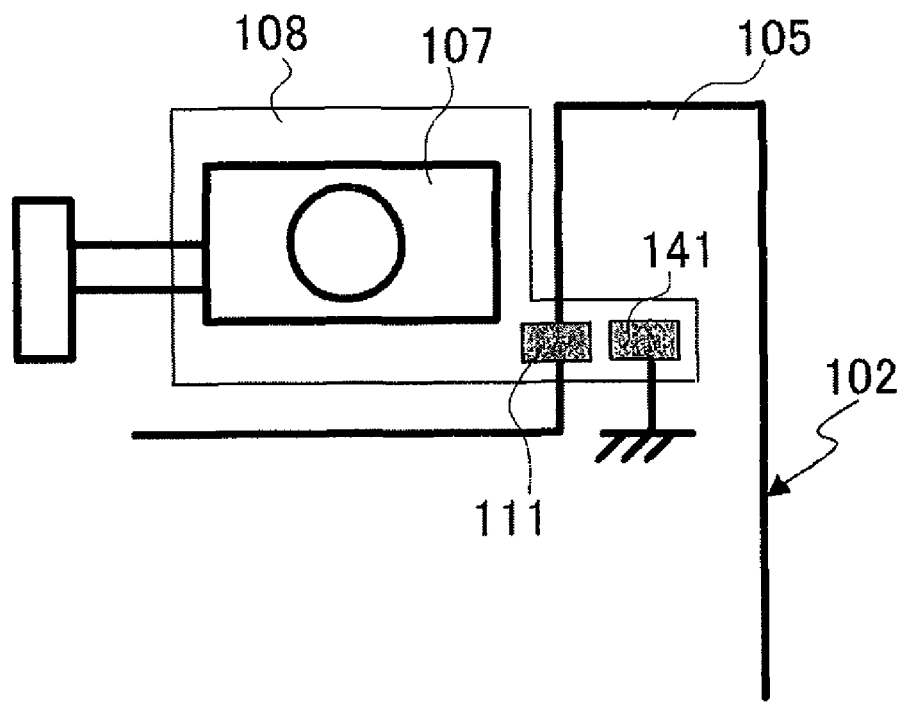
FIG. 16 shows a drawing explaining a structure of the connecting part of the camera shield, the frequency blocking section and the ground pattern according to embodiment 5.

In addition, as a second example, frequency blocking section 111 is provided on the surface of camera shield 108 in mobile phone 100 as shown in FIG. 16. Meanwhile, connecting part 141 is provided on the surface of partial substrate section 105 of circuit board 106. Then, camera shield 108 and partial substrate section 105 are arranged with the interval described above, and therefore camera shield 108, frequency blocking section 111 and the ground pattern can be reliably connected.

The disclosure of Japanese Patent Application No. 2007-284327, filed on Oct. 31, 2007, including the specification, drawings and abstract, is incorporated herein by reference in its entirety.

INDUSTRIAL APPLICABILITY

The mobile radio apparatus according to the present invention is useful as an apparatus being capable of preventing more reliably deterioration of communication performance caused by electromagnetic noise from the camera body and deterioration of antenna performance caused by the camera body.

The invention claimed is:

1. A mobile radio apparatus comprising:
    an imaging section;
    a circuit board that has a cutout in one end and includes a first partial substrate section and a second partial substrate section located in both sides of the imaging section provided in the cutout;
    a conductive member that is arranged in a vicinity of the imaging section; and
    a reactance element that connects between a ground of the circuit board and the conductive member.

2. The mobile radio apparatus according to claim 1, further comprising a connector section that electrically connects the imaging section and the circuit board,
    wherein an interval between the connector section and a connection point between the reactance element and the ground of the circuit board is greater than a predetermined value.

3. The mobile radio apparatus according to claim 2, wherein the predetermined value is equal to or more than one twentieth of a wavelength corresponding to a frequency used in communication.

4. The mobile radio apparatus according to claim 1, further comprising a filter that is connected to both the conductive member and the reactance element between the conductive member and the reactance element in series and has a frequency blocking characteristic differing from the frequency blocking characteristic of the reactance element.

5. The mobile radio apparatus according to claim 1, further comprising:
    a plurality of reactance elements that have different frequency blocking characteristics each other and are arranged in parallel; and
    a switch that switches the reactance elements to be connected with the conductive member in accordance with a frequency used in communication.

6. The mobile radio apparatus according to claim 2, further comprising an antenna power feeding section that is provided in the first partial substrate section, wherein:
    a connection point between the connector section and the circuit board is provided in the second partial substrate section; and
    the connection point between the reactance element and the ground of the circuit board is provided in the vicinity of the antenna power feeding section in the first partial substrate section.

* * * * *